(12) United States Patent
Ortenzi et al.

(10) Patent No.: US 12,063,762 B2
(45) Date of Patent: Aug. 13, 2024

(54) COOLING SERVERS WITH HYBRID WATER TO AIR AND HEAT PIPE AUGMENTATION TO CHIP LEVEL COOLING OUTSIDE OF SERVER

(71) Applicant: Dynamic Data Centers Solutions, Inc., St. Louis, MO (US)

(72) Inventors: Mark David Ortenzi, Escondido, CA (US); Chris Orlando, Escondido, CA (US)

(73) Assignee: DYNAMIC DATA CENTERS SOLUTIONS, INC., St. Louis, MO (US)

(*) Notice: Subject to any disclaimer, the term of this patent is extended or adjusted under 35 U.S.C. 154(b) by 137 days.

(21) Appl. No.: 17/652,323

(22) Filed: Feb. 24, 2022

(65) Prior Publication Data

US 2022/0272875 A1   Aug. 25, 2022

Related U.S. Application Data

(60) Provisional application No. 63/200,259, filed on Feb. 24, 2021.

(51) Int. Cl.
*H05K 7/20* (2006.01)

(52) U.S. Cl.
CPC ..... *H05K 7/20818* (2013.01); *H05K 7/20327* (2013.01); *H05K 7/20336* (2013.01); *H05K 7/20736* (2013.01)

(58) Field of Classification Search
CPC ........... H05K 7/20327; H05K 7/20336; H05K 7/20809; H05K 7/20818; H05K 7/20781; H05K 7/20736
See application file for complete search history.

(56) References Cited

U.S. PATENT DOCUMENTS

| | | | |
|---|---|---|---|
| 2005/0068728 A1* | 3/2005 | Chu | H05K 7/20772 361/679.48 |
| 2018/0042141 A1* | 2/2018 | Qu | H05K 7/20745 |
| 2022/0206547 A1* | 6/2022 | Heydari | G05B 13/027 |

FOREIGN PATENT DOCUMENTS

JP       2013175069 A  *  9/2013

\* cited by examiner

*Primary Examiner* — Frantz F Jules
*Assistant Examiner* — Martha Tadesse
(74) *Attorney, Agent, or Firm* — Hogan Lovells US LLP

(57) ABSTRACT

A cooling system for cooling chips in a server rack uses a heat pipe, providing a cooled connection to the chips in a server rack. A coolant for the heat pipe is located outside the rack, so that water never needs to be brought into the rack.

9 Claims, 4 Drawing Sheets

COOLING SERVERS WITH HYBRID WATER TO AIR AND HEAT PIPE AUGMENTATION TO CHIP LEVEL COOLING OUTSIDE OF SERVER

This application claims priority from Provisional application No. 63/200,259, filed Feb. 24, 2021, the entire contents of which are herewith incorporated by reference.

BACKGROUND OF THE INVENTION

Computing and other equipment can be housed in racks along with other computing equipment.

These racks of computer equipment can often be housed in facilities known as computer data centers which house the electronic hardware in rack based cabinets.

SUMMARY

The inventor recognized the need for a new and effective cooling technology.

Embodiments as described herein define novel apparatus, systems, and methods for efficiently cooling computing devices having heat-generating electronic components, such as, for example, chips in an independently operable servers in a closed loop cooling environment.

Embodiments describe a system that extends heat pipes outside the server boundary, so that no cooling water needs to be brought inside the server case. The cooling can be in a sealed enclosure that has cooler elements, with each cooler element associated with a single heat pipe, and each heat pipe associated with a single chip.

The embodiments describe adaptive cooling that carries out cooling as needed for a specific environment.

BRIEF DESCRIPTION OF THE DRAWINGS

The drawings show aspects of the invention as described herein, and specifically.

DETAILED DESCRIPTION

The present application describes a hybrid cooling server, that operates using smart modulating valves and a push pull fan to carry out a simultaneous chip level cooling of multiple items in an equipment rack, including cooling of "chips", specifically CPUs and GPUs in the equipment rack.

The term "hybrid" is used to connote the configuration system used herein, which uses front to back air cooling along with a hybrid combining heat pipe that connects to individually cooled chips. This allows for more cooling efficiency.

Heat pipe technology is used to pull heat off the CPU and GPU chips 15. These heat pipes cool the chips themselves or a heat sink connected to the chips. In a traditional heat pipe, the equipment is cooled using ambient air, thus filtering the heat into a large room.

As explained herein, the present application extends the cooling outside the server as part of a closed loop cooling system. This closed loop design used for the CPU and GPU heat pipe cooling takes the technology a step further, by conducting the heat from the CPU/GPUs to a location outside the server part of the cooling rack, while still maintaining the closed loop system with airflow. The liquid cooling supply is not brought into the server 14 part of the rack, but rather stays outside of the server portion 14.

Figure 1:
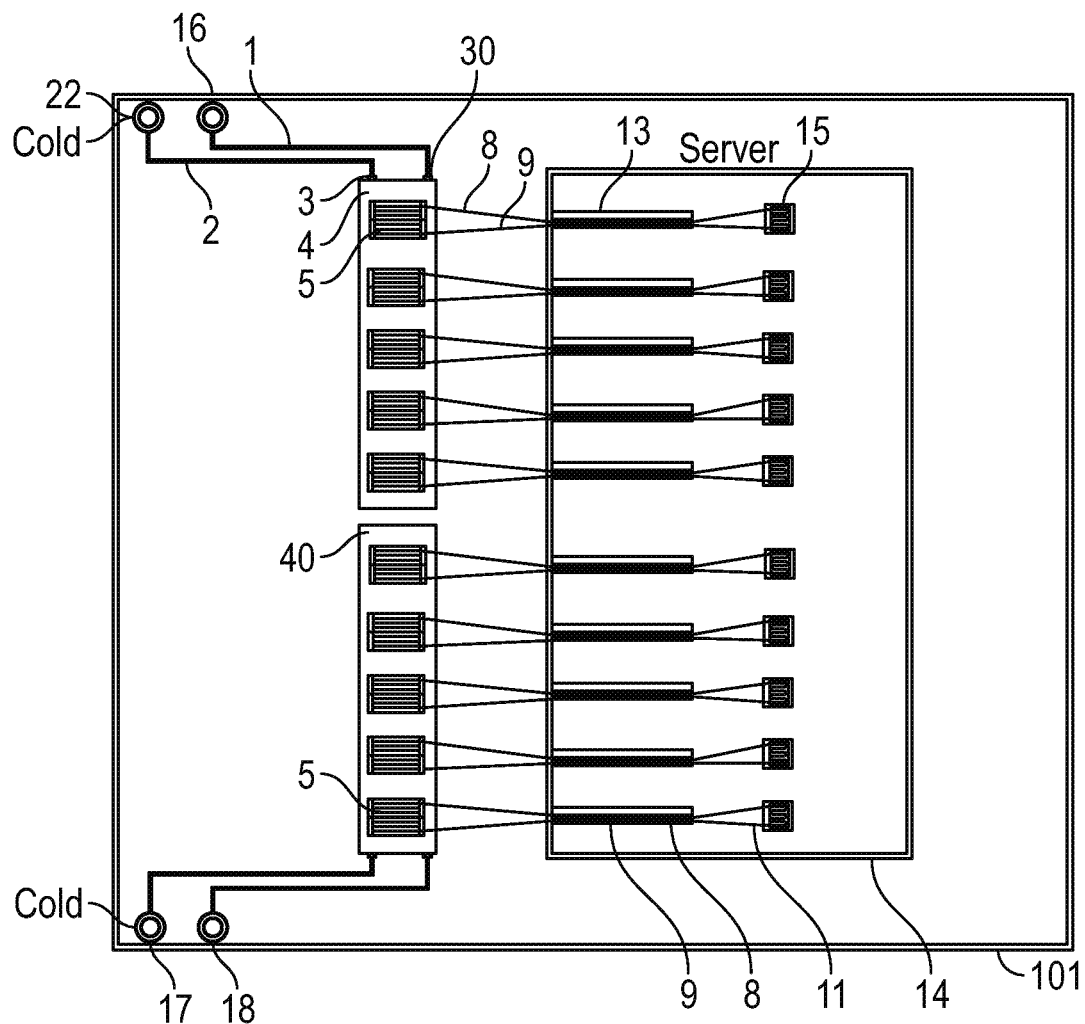
FIG. 1 shows a schematic of cooling by extending heat pipes outside the cooled part of the cabinet.

FIG. 1 shows a schematic diagram of an embodiment. A server case 14 includes plural heat producing elements to be cooled. In this embodiment, the elements to be cooled are "chips" which herein can include graphic processing units GPU's and central processing units or CPUs. The GPUs and CPUs may be themselves connected to heat sinks.

The cooled chip 15 is cooled via a heat pipe 13. The heat pipe 13 includes a cold supply 8, which receives cold from a sealed, cooled encasement 4. The cold 8 is conducted to the chips 15, which release their heat. The heat released from the chips is circulated back to the encasement as a hot line 9. The hot line 9 forms a hot side flow which transfers the heat received from the chips to the encasement. The encasement houses multiple cooler units 5 that are cooled by the fluid, e.g, cooled water, in the encasement 4. The cooler unit 5 can be a cooling fin sitting in the cooled water in the encasement. Each cooler unit 5 is individually associated with each chip; however, multiple cooling units 5 can be located within a single one of the sealed encasements 4.

The cooler 5 receives the cold water supply and is cooled using cooling from the water. That cooling is conducted to the chips 15 via the heat pipes 13. The heat from the chips is received via the heat pipes 13, and conducted to the coolers 5 to be cooled outside the server part of the case 14. This operates to extend the heat pipes 13, so the cooling fins for the heat pipe are located outside the server case 14.

The encasement 4 is sealed, and receives chilled/cold water. The encasement 4 has a cold side manifold 22 which receives the cold water via the line 2 into a connection 3 that connects into the sealed encasement 4. The cooled water cools the multiple coolers 5 in the sealed encasement 4. The water in the sealed encasement is heated as it passes over the coolers 5. This heated water is exhausted via a connection 30 to hot water line 1 e.g. a flex hose, and out to the hot water manifold 16. The connections can be via quick disconnects tied to manifolds located on both sides of the rack 101, so that the rack can be easily relocated, In a similar way, there is another encasement 40 that is connected to cold water manifold 17 and hot water manifold 18.

In embodiments, the encasements 4 and 40 are physically on opposite sides of the rack. In one embodiment, one of the encasements is on the left of the rack and the other is on the right of the rack. In another embodiment, one of the encasements is on the front of the rack and the other at the back of the rack.

An embodiment as described herein has one encasement 4 on the left of the rack, referred to as the left side of the rack, and the other encasement 40 on the right side of the rack. The encasements are supplied via the supply "Cold" 17, 22 water, and the heated water is returned via the "Hot" lines 16,18.

Figure 3:
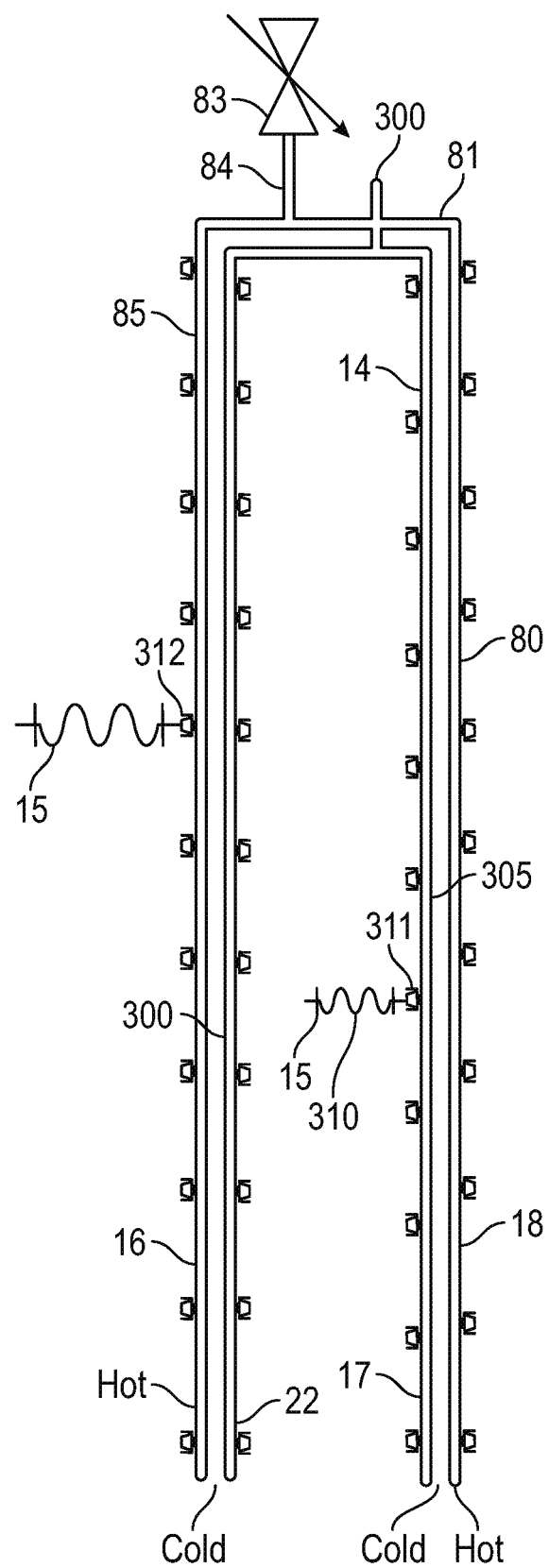
FIG. 3 shows different parts for receiving and returning water cooling from a cooling line.

In an embodiment, the multiple cold supplies and the multiple hot supplies can be respectively tied together on the outside of the rack with a smart valve shown as 83 in FIG. 3. The smart valve allows isolation of cooling requirements in the rack. The invention uses front to back cooling and deltas based on manufacturer requirements for cooling.

In this way, CPUs; GPUs and other heat sources can be cooled outside the server part of the rack without bringing water into the server part of the rack.

Using direct communications using current APIs, the flow can be maintained based on temperatures on both CPUs and GPUs to maintain the most efficient and controlled environment maintained in this configuration. This structure works in conjunction with an integrated control that manages a psychometric chart based on sensors that are managed between internal and external locations. AI and Learning designs are used by a rack controller to maintain both front to rack cooling, as well as a chip specific algorithm also working in conjunction on front server and back sensors. Working with API to the BIOS level and support allows any specific relationship on both power management and required performance needed.

Figure 2:
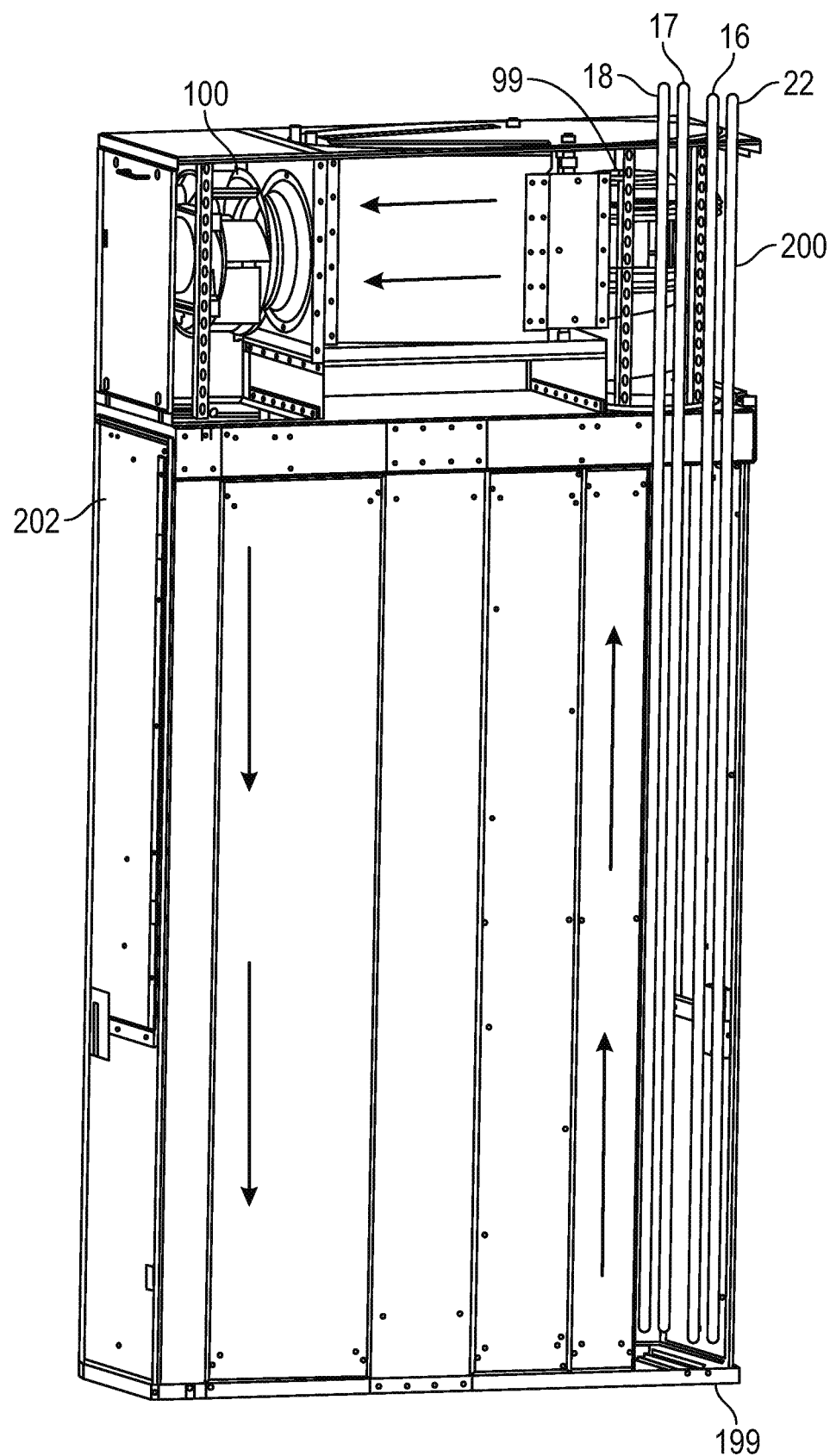
FIG. 2 shows the cooling flow.

In addition to the heat pipe cooling, there is also air cooling used in the rack, thus producing the hybrid effect of both air cooling and heat pipe-based conduction cooling. FIG. 2 illustrates the rack and the air cooling path that is used in an embodiment. The system uses two fans 99,100, configured in a push pull configuration. The fan 99 is in a pull configuration on the hot side 200 of the rack, and the fan 100 is in the push configuration on the cold side 202 of the rack 199. This pushes air across the cooled items in the rack in addition to the heat pipes, thus creating the hybrid cooling.

Manifold supply lines are also shown in FIG. 2, with a right side hot side manifold, 18 and a right side cold side manifold 17. In a similar way, the rack includes a left side hot side manifold 16 and the left side cold side manifold supply 22. The different sides of the rack are cooled not only by separate encasements, but also by separate airflows, in an embodiment.

FIG. 3 shows the valving operation from the hot and cold water lines. The cold water line on the right 17 is connected by a number of smart valves, which can be opened as needed, e.g, when more water cooling is detected to be necessary. In a similar way, the left side cold supply 22 is also connected to a number of smart valves. The water, once heated by the chips, is returned to the right side hot line 18 and the left side hot line 16.

In an embodiment, there can also be a top of rack cold supply 300. The manifolds can receive the cold water, and return the hot water, there being a right side manifold hot return 80, and a top of rack right side manifold return 81. The return side can also include a smart valve 83, connected via the manifold return 84. 85 is the manifold side hot return.

Each location of connection can have a quick connect connection. For example, the supply connection 310 to a chip 15 can be via quick connect 311. In a similar way, the hot supply, from the manifold or from the chip 15 can be connected via a quick connect 312.

The manifold smart valve 83 sits between the manifold returns 81, 85 for the left and right side of the rack respectively. These are driven to coolers, and return via the return 82 to the manifold cold side 305. The water from or the coolant from the cold side 305 is sent via a flexible hose 310 to load 15, e.g, the chip requiring cooling. In a similar way, the heated coolant, after cooling the chip 92 is returned via a flexible hose to the hot side.

At various locations along both the hot side 300 and the cold side 305, there are a number of quick disconnects 90, each of which can be connected to either hot side of a coolant element or a cold side of the coolant element.

Figure 4:
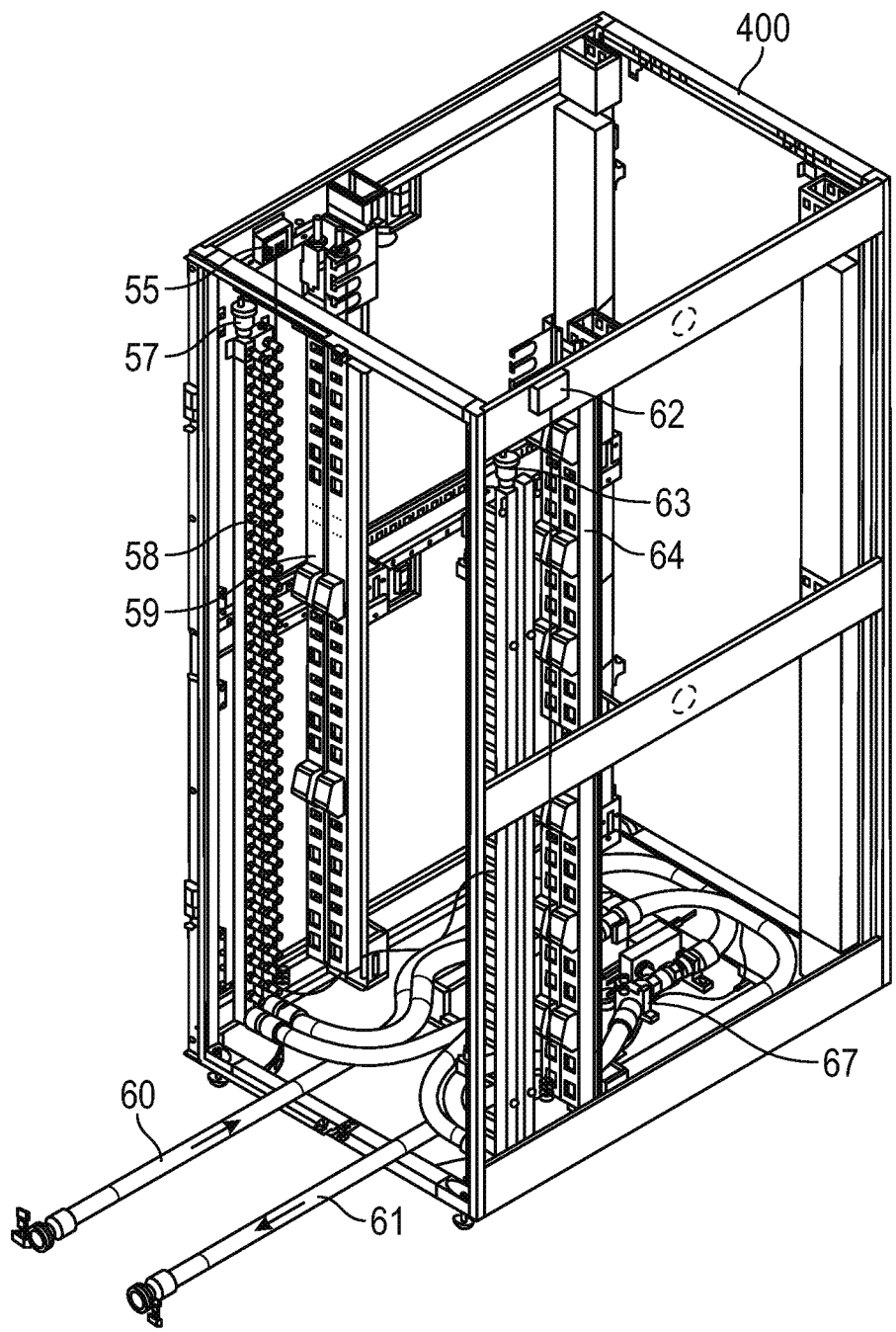
FIG. 4 shows the parts of a rack of an embodiment.

The rack with the coolant structure therein is shown in FIG. 4 as 400. A main cold water supply 60 brings cold water into the rack, while the hot water return 61 removes the hot water from the rack for cooling. The hot water is directed, as described herein, to a water disconnect assembly 58, which includes a plurality of different water disconnect connectors. As conventional, a power distribution unit 59, 64 supplies power to the different electronic devices in the rack.

A network management switch 55 carries out the maintaining of supply in the rack.

The left rack side can include an automatic air vent valve, 57 and a power distribution unit 59. The right side can similarly include an automatic air vent valve 63 and power distribution unit 64. The water is supplied via the main cold water hose 60, and exhausted via the main hot water hose 61. A solenoid valve 67 can be used to control the supply of cooling water according to the water control.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art. For example, other kinds of fans can be used.

In one or more exemplary embodiments, the functions described may be implemented in hardware, software, firmware, or any combination thereof. If implemented in software, the functions may be stored on or transmitted over as one or more instructions or code on a computer-readable medium. Functions can also be carried out by programmed computer readable media which can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A cooling system for cooling heated elements in a server rack, comprising:

a heat pipe, providing a cooled connection to the heated elements in the server rack, and receiving a heated connection from the heated elements, the heated connection which is created by the heated elements exhausting heat to the heat pipe, wherein the heated elements include CPU and GPU chips;

the heat pipe extending from an area outside of and separated from the server rack to the heated elements inside the server rack; and a cooling manifold, located in the area outside of and separated from the server rack, the cooling manifold including a sealed enclosure with plural cooling units inside the sealed enclosure, wherein each of the plural cooling units are individually associated with one of the chips, the cooling units receiving the heated connection from the heat pipe, the sealed enclosure receiving a cold water supply which is passed over the plural cooling units and cooling the plural cooling units using the cold water supply, to cool the cooling units to create the cooled connection to the heat pipe;

where water is supplied to the sealed enclosure, and water is not supplied to any element in the server rack, to cool the heated elements in the server rack without bringing water into the server rack.

2. The system as in claim 1, wherein each of the plural cooling units includes a cooling fin that is individually associated with one of the chips to receive the heat from the heat pipe associated with the one of the chips, and where the cooling fin is cooled by the water in the sealed enclosure.

3. The system as in claim 1, wherein the sealed enclosure is a first sealed enclosure on a first side of the rack, and further comprising a second sealed enclosure on a second side of the rack, where the first sealed enclosure includes a first cold water supply and exhausts a second hot water supply, and the second sealed enclosure receives a second cold water supply and exhausts a second cold water supply.

4. The system as in claim 2, wherein the heat pipe includes a cold section extending from a cooled side of one of the cooling units to the heated element, and a hot section extending from a heated part of the heated element which has been heated by heating a heated side of the cooling units.

5. The system as in claim 3, further comprising at least one smart valve, selectively defining an amount of cooling to be provided to the first and second sealed enclosures based on an amount of heating provided to the sealed enclosure.

6. The system as in claim 1, where the rack is also air cooled and a left side of the rack is air cooled separately from a right side of the rack.

7. The system as in claim 1, wherein there is a cooled side of the rack, and there are first and second fans, a first fan operating to pull air that has been heated by the heated elements towards the cooled side of the rack, and a second fan facing towards the cooled side of the rack operating to push cooled air towards the cooled side of the rack.

8. A cooling system for cooling chips in a server rack, comprising:

plural CPU and GPU chips, housed and powered in the rack;

plural heat pipes, each heat pipe connected to a chip at a first end of the heat pipe, and providing a cooled connection to the chip in the server rack, plural cooling fins, a second end of each heat pipes connected to a cooling fin, each cooling fin associated with a single heat pipe which is associated with a single chip;

a coolant source for the chips, including a sealed enclosure, physically outside the server rack that contains the chips, holding plural of the cooling fins, the sealed enclosure receiving a cold water supply as the coolant source for the heat pipe, to cool the chips in the server rack without bringing water into the server rack, where the coolant source for the chips is located outside the server rack.

9. The cooling system as in claim 2, further comprising a cooling fan configuration which also blows cooled air over the chips.

* * * * *